(12) United States Patent
Watanabe

(10) Patent No.: US 10,840,938 B2
(45) Date of Patent: Nov. 17, 2020

(54) A/D CONVERSION CIRCUIT WITH SHIFTED ENCODE VALUES

(71) Applicant: DENSO CORPORATION, Kariya (JP)

(72) Inventor: Takamoto Watanabe, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/583,757

(22) Filed: Sep. 26, 2019

(65) Prior Publication Data

US 2020/0204189 A1   Jun. 25, 2020

(30) Foreign Application Priority Data

Dec. 21, 2018  (JP) ................................ 2018-239608

(51) Int. Cl.
  *H03M 1/60* (2006.01)
  *H03M 1/12* (2006.01)
  *H03M 1/64* (2006.01)

(52) U.S. Cl.
  CPC ........... *H03M 1/60* (2013.01); *H03M 1/1255* (2013.01); *H03M 1/645* (2013.01)

(58) Field of Classification Search
  CPC ..................................................... H03M 1/60
  USPC ................................ 341/155, 156, 158, 157
  See application file for complete search history.

(56) References Cited

U.S. PATENT DOCUMENTS

| | | | | |
|---|---|---|---|---|
| 7,271,757 B2 * | 9/2007 | Nakamoto | .......... | H03M 1/0809 341/160 |
| 7,843,374 B2 * | 11/2010 | Kojima | .................... | G06F 7/74 341/155 |
| 8,471,754 B2 * | 6/2013 | Yamamoto | ....... | G01R 31/31709 341/155 |
| 2003/0201927 A1 | 10/2003 | Watanabe et al. | | |
| 2004/0239546 A1 * | 12/2004 | Watanabe | ............. | H03M 1/206 341/157 |

FOREIGN PATENT DOCUMENTS

JP   2018-182561 A   11/2018

* cited by examiner

*Primary Examiner* — Peguy Jean Pierre
(74) *Attorney, Agent, or Firm* — Posz Law Group, PLC

(57) ABSTRACT

An A/D conversion circuit converts an analog signal into numerical data. The A/D conversion circuit includes: a pulse delay circuit that includes an odd number of delay units connected in series, and inverting and delaying a pulse signal, and that changes the numeral number of the delay units which the pulse signal passes through in accordance with a value of the analog signal; latch circuits that synchronize the pulse signal with sampling clocks, and latch the pulse signal; encoders that set a position of the pulse signal to the numerical data by circulating encode values periodically set in order from an initial value to a final value to synchronously sample the encode values; subtractors that calculate each of differences between a previous value and a current value; and an adder that adds subtraction results. The encode values are set to be shifted between at least two encoders.

9 Claims, 16 Drawing Sheets

+

A/D CONVERSION CIRCUIT WITH SHIFTED ENCODE VALUES

CROSS REFERENCE TO RELATED APPLICATION

The present application claims the benefit of priority from Japanese Patent Application No. 2018-239608 filed on Dec. 21, 2018. The entire disclosure of the above application is incorporated herein by reference.

TECHNICAL FIELD

The present disclosure relates an A/D conversion circuit changing an analog input signal into numerical data by utilizing a pulse delay circuit in which multiple delay units delaying a pulse signal and outputting the pulse signal are connected in series.

BACKGROUND

Development of an A/D conversion circuit has been advanced so that a high-resolution digital value can be acquired while the configuration is simplified. An A/D conversion device includes a pulse delay circuit in which multiple delay units including various gate circuits are connected in series. This A/D conversion device is configured to input a transmission pulse signal (start pulse) while supplying the analog input signal corresponding to an A/D conversion target as a power supply voltage of the pulse delay circuit.

The pulse delay circuit delays the pulse signal based on a speed in accordance with a delay time depending on the power supply voltage of each of the delay units. The pulse delay circuit converts the analog input signal into the numerical data by counting the number of delay units which the pulse signal has passed though within a predetermined sampling time while transmitting the pulse signal. This A/D conversion circuit includes one pulse delay circuit, multiple pulse position digitization portions operated by multiple sampling clocks, a sampling clock generation circuit, and an encoder digitizing each of pulse positions. The A/D conversion circuit is called as a clock edge shift (CKES) type A/D conversion circuit.

SUMMARY

One example aspect of the present disclosure provides an A/D conversion circuit capable of acquiring a highly accurate A/D conversion result by preventing errors of output data of multiple encoders from being integrated.

BRIEF DESCRIPTION OF DRAWINGS

The above object and other objects, features and advantages of the present disclosure will become more apparent from the following detailed description with reference to the attached drawings. In the drawings.

DETAILED DESCRIPTION

Figure 1:
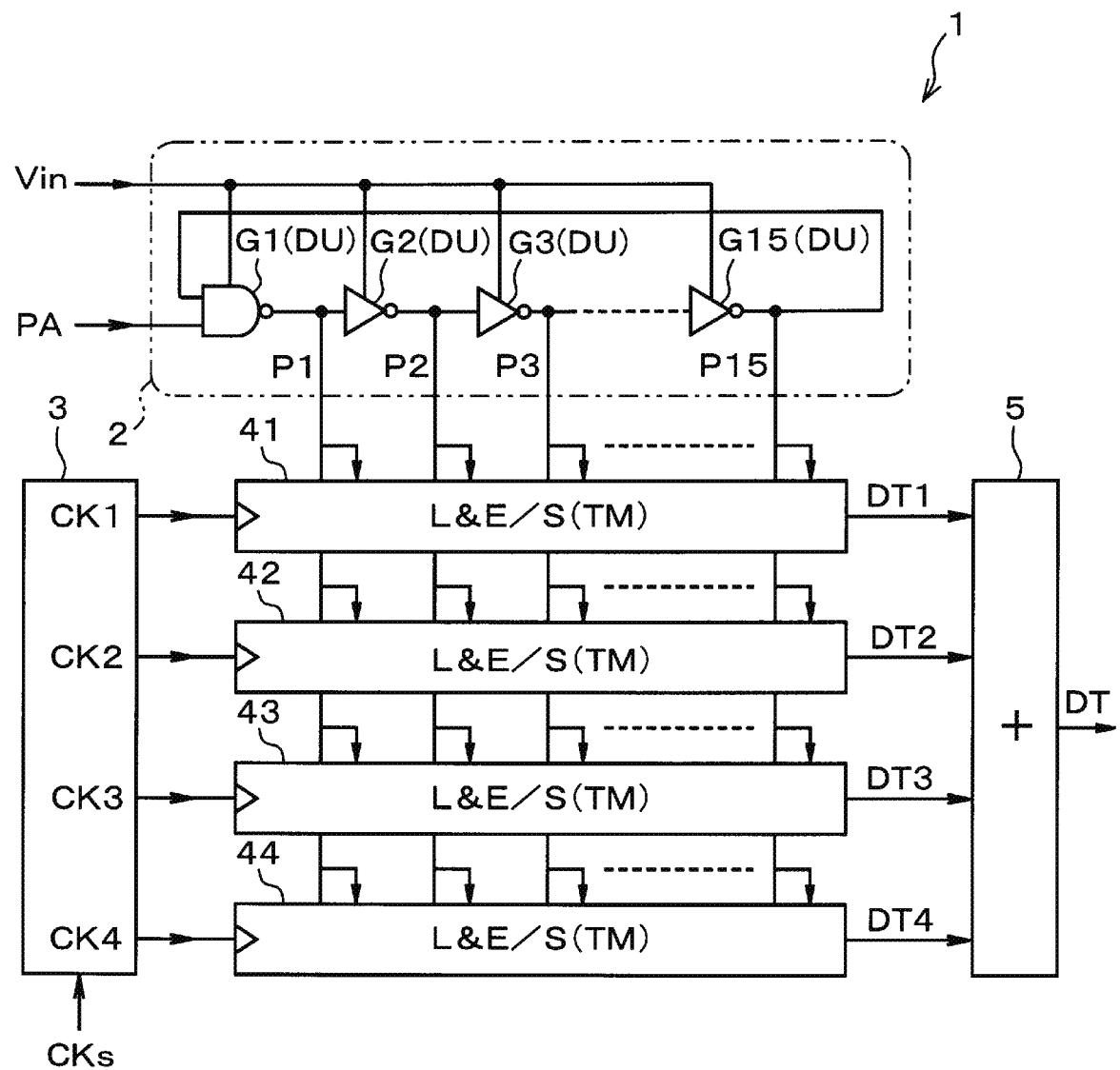
FIG. 1 is an electrical configuration diagram of an A/D conversion circuit according to a first embodiment.

When a pulse delay circuit includes an odd number of pulse delay unit as an A/D conversion circuit, a peripheral circuit configuration including delay units of the n-th power of 2 may be unemployable. Hereinafter, the n-th power of 2 may be also referred to as a $2^n$. In this case, errors such as code missing occur in output data of multiple encoders. With the demand for speeding up the operation in recent years, in a clock edge shift type A/D conversion circuit, a possibility that the errors are integrated may be high. The large errors may be easy to occur in an A/D conversion result, and an A/D conversion accuracy may decrease.

An example embodiment provides an A/D conversion circuit capable of acquiring a highly accurate A/D conversion result by preventing errors of output data of multiple encoders from being integrated.

According to one example, encode values of multiple encoders are sampled based on a sampling clock. The encode values sequentially set from an initial value to a final value are circulated and synchronously sampled. Each of multiple subtractors calculates a difference between a previous value of numerical data of the encoder synchronously sampled by the successive sampling clock and a current value.

The encoder synchronously samples the encode value by the successive sampling clock. The subtractor calculates the difference between the current value of the sequentially set encode value and the previous value. The difference depends on a movement speed of the pulse signal. Therefore, an adder adds subtraction results of the multiple subtractors, and thereby it may be possible to output digital data depending on the magnitude of the analog signal correlated with the movement speed of the pulse signal.

When the encode values of the multiple encoders are synchronously sampled by each of the temporally successive sampling clocks, for example, the previous value may be set to a value close to the final value of the encode value. The current value may circulate the final value, return to a value close to the initial value of the encode value, and be set to the value close to the initial value. In this case, it is assumed that the adder adds the subtraction results of the multiple subtractors. When the output data of the encoder returns from the final value of the encode value to the initial value to circulate, errors like a step, such as code increase (hereinafter, may be also referred to as step errors) occur.

Particularly, in order to synchronously sample the encode values of the multiple encoders by the sampling clocks, for example, when the encode values of many encoders are sampled and the step errors occur in these data, the errors become large due to the integration of the step errors.

According to the one example, the encode values are set to be shifted between at least two encoders. Therefore, even when the adder is affected by the step errors described above to add the subtraction results of the multiple subtractors, the step errors are integrated only for the few encoders. Therefore, it may be possible to add the subtraction results without integrating the step errors as much as possible. Thereby, it may be possible to prevent the errors as much as possible, and acquire the highly accurate A/D conversion result.

Hereinafter, embodiments of an A/D conversion device will be explained with reference to the drawings. In each embodiment, portions corresponding to the contents described in the preceding embodiments may be denoted by the same reference numerals or the similar reference numerals, and redundant explanation may be omitted. Particularly, the same reference or the similar reference is applied to the substantially same portion or the similar portion (for example, the same reference is applied to one place and tens place and the different reference is applied to hundreds place) in each embodiment. The explanation may be omitted as necessary.

First Embodiment

FIGS. 1 to 6 show explanatory diagrams of a first embodiment. A TAD 1 shown in FIG. 1 corresponds to a time A/D (TAD: time analog to digital converter) type A/D conversion circuit. For example, by utilizing a CMOS manufacturing process, the A/D conversion circuit is provided inside a semiconductor integrated circuit device such as a microcomputer mounted on an electronic control unit (hereinafter, may be also referred to as an ECU) of an automobile or such as a sensor product having a function of digital communication with the ECU. The TAD 1 receives an analog input signal Vin output from a sensor or the like, and converts this analog input signal Vin into A/D conversion data DT as a digital value to output the A/D conversion data DT.

The TAD 1 includes a ring arrangement pulse delay circuit (hereinafter, may be simply referred to as a pulse delay circuit:) 2 having a ring arrangement, a clock generation circuit 3, and multiple pulse position digitization portions (L&E/S: Latch-&-Encoder and Subtractor) 41 to 44, and an adder 5 serving as a processing unit. The pulse delay circuit 2 may be also referred to as a pulse delay portion 2. The adder 5 may be also referred to as an addition portion 5.

Explanation of Configuration of Pulse Delay Circuit

The pulse delay circuit 2 includes odd delay units DU (G1 to G15) each of which inverts and delays a pulse signal PA to output the pulse signal PA and which are connected in series to form, for example, a ring arrangement. The delay units DU, respectively, include gate circuits G1 to G15 that delay the pulse signal PA by a predetermined delay time Td and output the delayed signal. Therefore, in the following description, one or more delay units may be also referred as a "DU", or a "G1" to a "G15" as the gate circuit. In the embodiment, the pulse delay circuit 2 has a configuration in which the fifteen gate circuits G1 to G15 are connected. The pulse delay circuit 2 outputs the outputs of each of the delay units DU (G1 to G15) to pulse position digitization portions 41 to 48.

The analog input signal Vin corresponding to an A/D conversion target is input as a power supply voltage (drive voltage) to each of the gate circuits G1 to G15. Each of the gate circuits G1 to G15 outputs a signal in accordance with this analog input signal Vin. As each of the gate circuits G1 to G15, any gate circuit of which delay time Td is changed by the analog input signal Vin may be employed. However, as shown in FIG. 1, the delay units DU may be preferably configured by combination of the NAND gate G1 and the NOT gates G2 to G15.

The pulse delay circuit 2 shown in FIG. 1 includes one NAND gate G1 at the first stage, and the even number of NOT gates G2 to G15 at the subsequent stage. The even number of NOT gates G2 to G15 are connected in cascade. The NAND gate G1 is configured to receive the pulse signal PA and receive the output of the last stage NOT gate G15. Thus, when the pulse signal PA is input to the pulse delay circuit 2, the pulse delay circuit 2 transmits this pulse signal PA and circulates this pulse signal PA.

The NOT gates G2 to G15 include a single-stage CMOS inverter, in order to simplify a circuit configuration and shorten the delay time Td as much as possible to improve the time resolution.

It is assumed that the NOT gates G2 to G15 include the single-stage CMOS inverter. When the pulse signal PA input to the pulse delay circuit 2 is switched from a L level to a H level, the signal is switched from the H level to the L level at the odd stage, and switched from the L level to the H level at the even stage. When the NOT gates G2 to G15 include the single-stage CMOS inverter 6, it may be possible to shorten the delay time Td and acquire the A/D conversion result more quickly. The delay units DU are configured at the odd number of stages in total (that is, the total number of stages is odd). Therefore, the delay unit DU in which both of input and output are at the H level or the L level sequentially moves. Thereby, an oscillation state is held.

Configuration of Clock Generation Circuit

Figure 2:
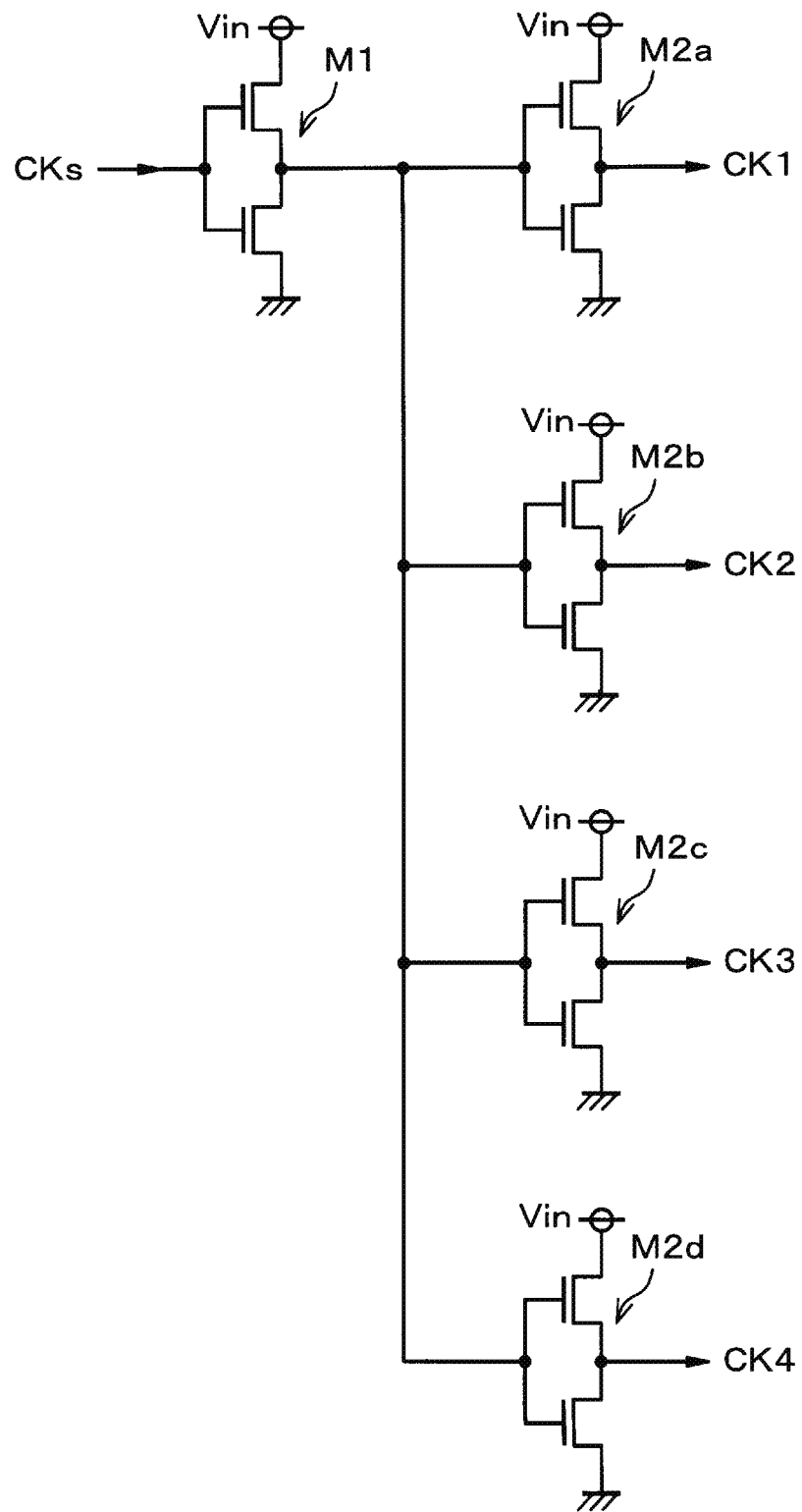
FIG. 2 is an electrical configuration diagram of a clock generation circuit.

As shown in FIG. 2, in the clock generation circuit 3, an inverter M1 is connected to a front stage, and inverters M2a to M2d are connected to the subsequent stage in parallel. Thereby, multiple sampling clocks CK1 to CKm are output. The subsequent stage may be also referred to as a back stage. In this configuration of FIG. 2, the inverter M1 is at the first stage, the inverters M2a to M2d are at the second stage. In the embodiment, the number of m is 4. In other words, the number of sampling clocks is 4.

The analog input signal Vin is supplied as the power supply voltage (drive voltage) to these inverters M1, and M2a to M2d at the multiple stages. The delay times of the sampling clocks CK1 to CK4 are adjusted in accordance with the delay time Td of the pulse signal PA of the pulse delay circuit 2. The clock generation circuit 3 generates the multiple sampling clocks CK1 to CK4 based on a sampling clock reference signal CKs input as a reference. The sampling clock reference signal CKs corresponds to a main sampling clock input from the outside, and is utilized for the A/D conversion.

The inverter M1 at the first stage receives the clock reference signal CKs, transmits the pulse, and outputs the pulse to the inverter M2 at the second stage. The inverters M2a to M2d at the second stage also transmit the pulse to output the pulse. The inverter M1 at the first stage and the multiple inverters M2a to M2d at the second stage include p-channel transistors and n-channel transistors. The inverters M2a to M2d have different gate widths and different gate lengths of the p-channel transistor and the n-channel transistor from each other, and relatively change a rising delay time difference ΔTs of clock edges. The sampling clocks CK1, and CK2 to CKm are set so that the rising times of the clock edges are delayed in order of the sampling clocks CK1, and CK2 to CKm.

Each of latch circuits 41a to 41d (see FIG. 3) is connected to the subsequent stage of these inverters M2a to M2d at the second stage. Thereby, latch timings of the latch circuits 41a to 41d of the pulse position digitization portions 41 to 44 are determined by the outputs of the inverters M2a to M2d.

A period Ts of the sampling clocks CK1 to CKm is set to a time longer than each delay time Td of each delay unit DU, for example, a certain time equal to or higher than multiple of the delay time Td of one delay unit DU. Each of the sampling clocks CK1 to CKm is set so that a phase difference between the clocks adjacent to each other is a certain time ΔTs corresponding to 1/m of the period.

The number of connection stages of the delay units DU of the pulse delay circuit 2 is set so that the pulse signal PA is transmittable for a longer time than the period Ts of the sampling clocks CK1 to CKm. The setting of the number of stages enables each of the pulse position digitization portions 41 to 44, synchronizes with the period Ts of the input sampling clocks CK1 to CKm, and performs a digitization operation predetermined times.

Configurations of Pulse Position Digitization Portions

Figure 3:
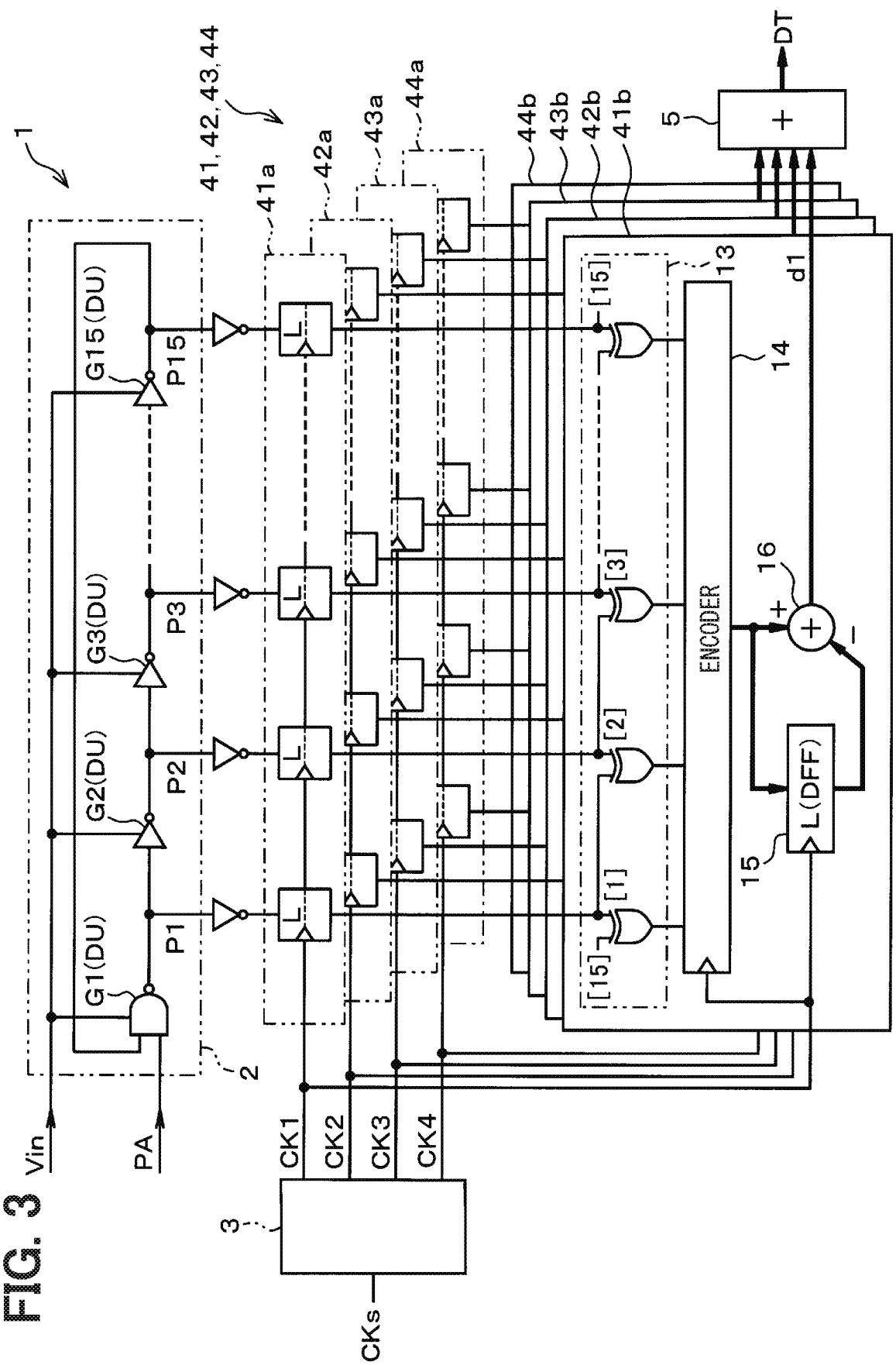
FIG. 3 is an electrical configuration diagram showing details of the A/D conversion circuit.

The entire configuration will be continuously described with reference to the detailed diagram of FIG. 3. The multiple pulse position digitization portions 41 to 44 synchronize with a timing of the clock edge of the rising timing or a falling timing of the sampling clocks CK1 to CK4, detect the number of delay units DU which the pulse signal PA have passed through inside the pulse delay circuit 2 within one period of the sampling clocks CK1 to CK4. The multiple pulse position digitization portions 41 to 44 output the A/D conversion data DT correlated to the detection result. The number of delay units may be also referred to as a numerical number of the delay units.

Particularly, the multiple pulse position digitization portions 41 to 44 calculate the number of delay units DU which the pulse signal PA has passed through inside the pulse delay circuit 2 within one period of each sampling clocks CK1 to CK4, based on a deviation between the previous value and the current value shown by digitization of the position of the pulse signal PA. Thereby, the multiple pulse position digitization portions 41 to 44 generate the A/D conversion data DT (DT1 to DT4) to output the A/D conversion data DT.

Specifically, the pulse position digitization portions 41 to 44 respectively include the latch circuits 41a to 41d and pulse position digitization portion main bodies 41b to 44b. The pulse position digitization portion main bodies 41b to 44b respectively include a pulse selector 13, an encoder 14, a latch circuit 15, and a subtractor 16. The subtractor 16 may be also referred to as a subtraction portion.

The latch circuits 41a to 41d respectively synchronize with the timings of the clock edges of the corresponding sampling clocks CK1 to CK4 to latch H/L levels of the outputs by each of the delay units DU of the pulse delay circuit 2. As shown in FIG. 3, the pulse selectors 13 are connected to exclusive OR gates at fifteen stages as the configuration of the drawing.

The pulse selectors 13 compare the held H/L levels that correspond to the output (for example, P1) of the delay units DU at the front stage and are held by the latch circuits 41a to 44a, with the H/L levels that correspond to the output (for example, P2) of the delay units DU at the own stage and are held by the latch circuits 41a to 44a. The pulse selectors 13 detect a position at which both of the outputs are at the H level or the L level, and output this detected position as an arrival position of the pulse signal PA to the encoders 14.

That is, the pulse selectors 13 of the pulse position digitization portion main bodies 41b to 44b detect, as the arrival position of the pulse signal PA, the position where the outputs of the delay units DU adjacent to each other in the pulse delay circuit 2 are at the same level. Thereby, the pulse selector 13 is able to detect the arrival position of the pulse signal PA circulating the pulse delay circuit 2.

The encoder 14 is configured to convert the detection result of the pulse selector 13 into the A/D conversion data DT, and thereby digitize the arrival position of the pulse signal PA in the pulse delay circuit 2. The latch circuit 15 latches the data output from the encoder 14, and thereby stores the data as the previous value. The subtractor 16 subtracts the previous value of the data stored in the latch circuit 15 from the current value of the data output from the encoder 14 by binary complement operation, and outputs this subtraction data as the numerical data DT1 to DTm.

The adder 5 generates the A/D conversion data DT of "n+log$_2$ m" bits by adding the numerical data DT1 to DTm corresponding to m digitalization results output from the multiple pulse position digitization portions 41 to 48.

In the A/D conversion circuit 1 configured as described above, the delay time Td of each delay unit DU changes in accordance with the magnitude of the signal voltage level of the analog input signal Vin. As the signal voltage level of the analog input signal Vin becomes higher, the on-resistance of the CMOS inverter transistor configuring each delay unit DU becomes lower. Therefore, the delay time Td becomes shorter. In this case, the movement speed of the pulse signal PA becomes high.

As the signal voltage level of the analog input signal Vin becomes lower, the on-resistance of the CMOS inverter transistor configuring each delay unit DU becomes higher. Therefore, the delay time Td becomes longer. In this case, the movement speed of the pulse signal PA becomes slow. Accordingly, in accordance with the magnitude of the signal voltage level of the analog input signal Vin, the numerical data DT1 to DT4 digitalized by the multiple pulse position digitization portions 41 to 44 change. The data obtained by the addition of the numerical data DT1 to DT4 is acquirable as the A/D conversion data DT correlated to the magnitude of the analog input signal Vin.

Figure 4:
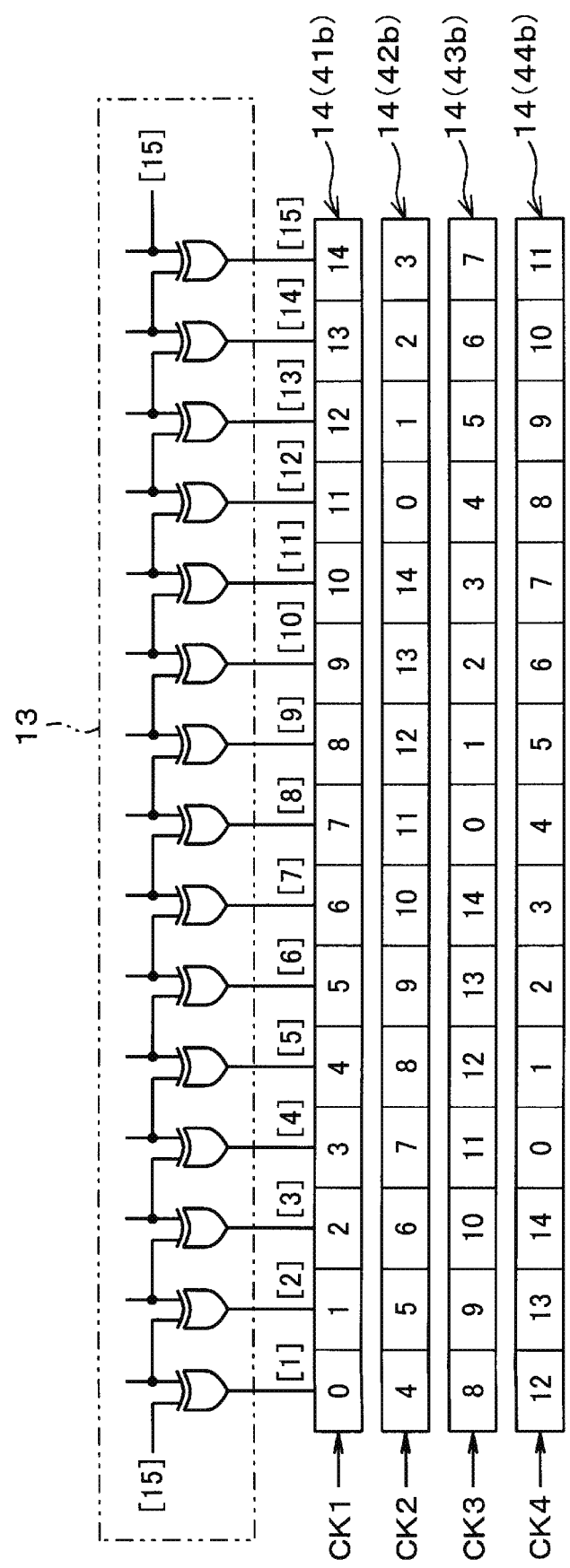
FIG. 4 is a content explanatory diagram of encode values of multiple encoders.
Figure 5:
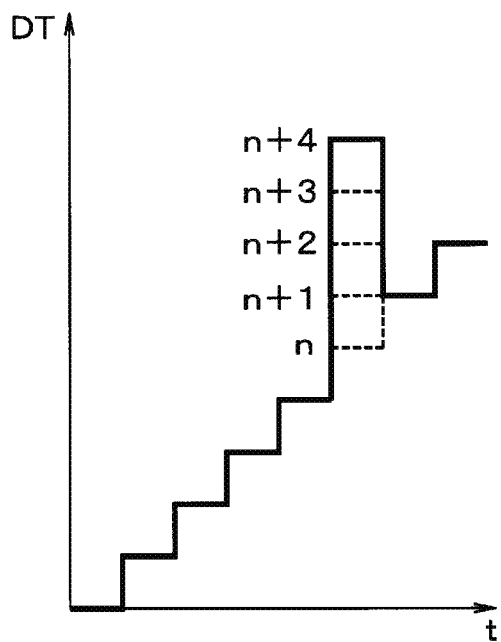
FIG. 5 is an explanatory diagram showing a comparative example of integration errors of code missing and code increase.

The encoders 14 of each of the pulse position digitization portion main bodies 41b to 44b are configured to output the encode values in order from the initial value "0" to the final value "14" as shown in FIG. 4. In FIG. 4, the encode value is represented in decimal. However, actually, the encoders 14 of each of the pulse position digitization portion main bodies 41b to 44b are configured by a logic circuit. The encoders 14 bit-output any encode value from the initial value "0" to the final value "14" as the digital data of two's complement by receiving the outputs of the pulse selectors 13 and the outputs of the sampling clocks CK1 to CK4.

The encoders 14 of each of the pulse position digitization portion main bodies 41b to 44b synchronously sample the encode values of each of the encoders 14 based on each of the respectively input sampling clocks CK1 to CK4, and output the encode values. Since the pulse selectors 13 circulate the position where the outputs of the delay units DU adjacent to each other are at the same level and output the position, the encoders 14 also circulate the encode values set in order from the initial value "0" to the final value "14" to synchronously sample the encode values.

The subtractor 16 calculates the difference between the previous value latched by the latch circuit 15 and the current value output from the encoder 14, and bit-outputs the difference as the digital data. For example, it is assumed that the encoder 14 of the pulse position digitization portion main body 41b outputs the encode value "0" at the generation timing of the sampling clock CK1, thereby the latch circuit 15 holds this "0", and thereafter the encoder 14 outputs the encode value "2" at the generation timing of the continuous next sampling clock CK1. In this case, the subtractor 16 outputs the difference "2" between the current value "2" and the previous value "0". This difference "2" corresponds to a value obtained by depending on the movement speed of the pulse signal PA.

Similarly, the encoders 14 of the pulse position digitization portion main bodies 42b to 44b respectively output the encode values "4", "8", and "12" at the generation timings of the sampling clocks CK2 to CK4. Thereby, the latch circuits 15 output "4", "8", and "12", and the latch circuits 15 respectively hold "4", "8", and "12". Thereafter the pulse signal PA moves. The encoders 14 respectively output the encode value "6", "10", and "14" at the generation timings of the continuous next sampling clocks CK2 to CK4. In this case, the subtractors 16 of the pulse position digitization portion main bodies 42b to 44b respectively output the difference "2". Therefore, the adder 5 outputs "8" by adding the subtraction results of the multiple subtractors 16. However, it may be possible to output the A/D conversion data DT in accordance with the magnitude of the analog input signal Vin correlated with the movement speed of the pulse signal PA, the A/D conversion data DT being equal to "8".

Although rising with the delay time ΔTs, the clock edges of the sampling clocks CK1 to CK4 are synchronously generated in principle. Therefore, at the generation timings of the sampling clocks CK1 to CK4, the encode value of the encoder 14 in accordance with the output of the generally same delay unit DU is output.

Therefore, the addition value of the difference obtained by the subtraction of the subtractor 16 becomes the A/D conversion data DT depending on the analog input signal Vin. The adder 5 inputs these numerical data DT1 to DTm to add the numerical data DT1 to DTm. Therefore, the A/D conversion data DT is accordance with a value obtained by averaging the numerical data DT1 to DT4 acquired by each of the pulse position digitization portions 41 to 44 during the time Ts within one period of each of the sampling clocks CK1 to CKm, and is obtained. The resolution of this ND conversion data DT becomes a high resolution compared with the resolutions of the numerical data DT1 to DT4 acquired by the pulse position digitization portions 41 to 44. Furthermore, the resolution of this ND conversion data DT becomes the high resolution in accordance with the added bit number m (in this case, 4).

When the encode values of the multiple encoders 14 are synchronously sampled by each of the temporally successive sampling clocks CK1 to CKm, for example, the previous value may be set to a value close to the final value "14" of the encode value, and the current value may circulate the final value "14", may return to a value close to the initial value "0" of the encode value, and may be set to the value close to the initial value "0".

In this case, it is assumed that the adder 5 adds the subtraction results of the multiple subtractors 16. When output data of the encoder 14 returns from the final value "14" of the encode value to the initial value "0" to circulate, errors like a step, such as code increase (hereinafter, may be also referred to as step errors) occur.

Particularly, in order to synchronously sample the encode values of the multiple encoders 14 by the sampling clocks CK1 to CKm, for example, when the encode values of many encoders 14 are sampled and the step errors in these data, these errors become large due to the integration of the step errors.

In the embodiment, the encode value is set to be shifted among the encoders 14 of the each of the pulse position digitization portion main bodies 41b to 44b. Particularly, a shift amount Dts of the encode value among the encoders 14 of each of the pulse position digitization portion main bodies 41b to 44b is set to "4". The encode value sequentially shifts. The relation among the shift amount Dts, a clock edge shift Nckes of the sampling clocks CK1 to CK4, and a delay unit DU number Ndu is preferably defined so as to substantially satisfy the following formula (1).

$$Dts \approx Ndu/Nckes \qquad (1)$$

In the embodiment, it is set that the shift amount Dts=15/4≈4. It may be possible to equally allocate the shift amount by this setting.

Even when the adder 5 is affected by the step error described above and adds the subtraction results of the multiple subtractors 16, the corresponding step errors are integrated only by a small number of the encoders 14. As a result, it may be possible to add the subtraction result without integrating the step errors as much as possible. Thereby, it may be possible to prevent the errors as much as possible, and acquire the high accurate ND conversion result.

Hereinafter, specific examples of the comparative embodiment and the embodiment will be described in comparison.

Specific Example of Comparison Embodiment

For example, a case where the encode values in accordance with all of the sampling clocks CK1 to CKm are not shifted is assumed. A case where all of the values (vertically aligned values in FIG. 4) set by the exclusive OR gates of the pulse selectors 13 in accordance with each of bits [1] to [15] are same is assumed with reference to FIG. 4.

When the encoder 14 outputs the final value "14" as the previous value and circulates the final value "14" of the encode value as the current value, returns to the value "2" close to the initial value "0", and outputs the value, each of the pulse position digitization portion main bodies 41b to 44b outputs the calculation result of the two's complement of the subtraction value obtained by subtracting the previous value "14" from the current value "2". As described above, when the encode value is not shifted, the adder 5 integrates four subtraction results including the step errors in accordance with the sampling clocks CK1 to CK4. As shown by the drawing in FIG. 5, the code increase in which the integration error obtained by the integration of four errors is added to a correct value may occur in the A/D conversion data DT.

Specific Example of the Embodiment

By contrast, in the embodiment, the encode values are shifted by "4" from each other. Therefore, even when the encode values of the encoder 14 of one pulse position digitization portion main body 41b are the previous value "14" and the current value "2" and therefore the output includes the step error, the possibility that the encoders 14 of the other pulse position digitization portion main bodies 41b to 44b output the data without including the step error increases. For example, the encoder 14 of the pulse position digitization portion main body 41b outputs the previous value "3" and the current value "6". The encoder 14 of the pulse position digitization portion main body 43b outputs the previous value "7" and the current value "10". The encoder 14 of the pulse position digitization portion main body 44b outputs the previous value "11" and the current value "14". In this case, the step error is not included.

Figure 6:
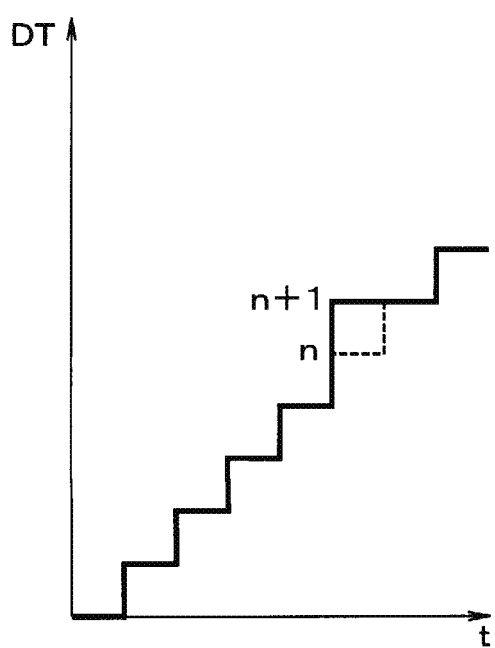
FIG. 6 is an explanatory diagram of an effect preventing an integration error.

Therefore, even when the adder 5 is affected by the step error described above and adds the subtraction results of the multiple subtractors 16, the corresponding step errors are integrated only by a few (one) encoder 14, as shown by the drawing in FIG. 6. Therefore, it may be possible to add the subtraction results without integrating the step errors as much as possible. Thereby, it may be possible to prevent the errors as much as possible, and acquire the highly accurate A/D conversion result.

The shift amounts Dts are equally set to "4" between the encode values of each of the encoders 14. Therefore, it may be possible to reduce occurrence bias of the step error when the A/D conversion processes are executed for many times. It may be possible to equalize the ratio of the step error occurrence.

The shift amount Dts is, for example, larger than that in the third embodiment described later. Therefore, it may be possible to reduce the number of encoders 14 in which the step error occurs for one A/D conversion process.

Second Embodiment

Figure 7:
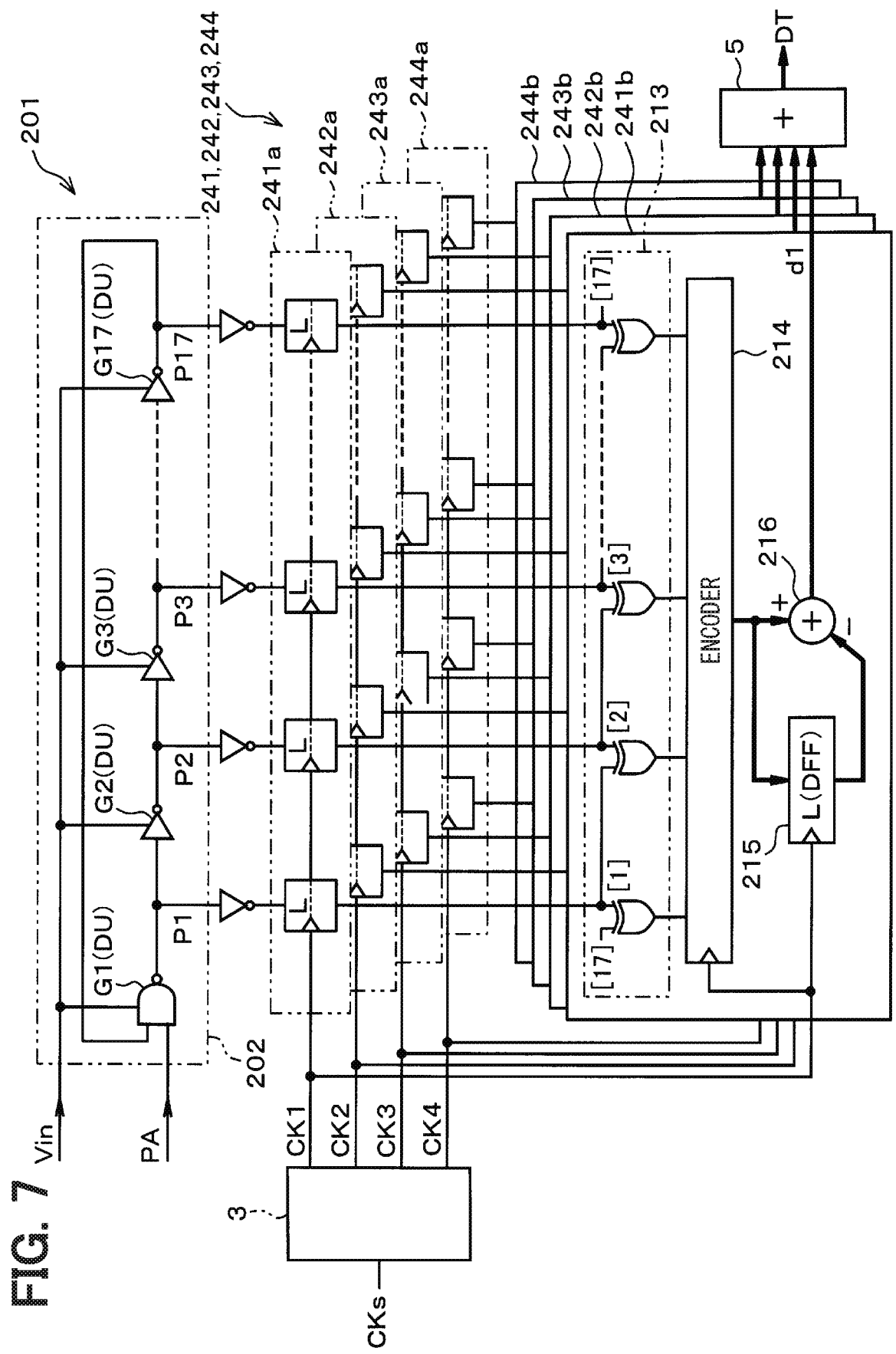
FIG. 7 is an electrical configuration diagram showing details of the A/D conversion circuit according to a second embodiment.
Figure 8:
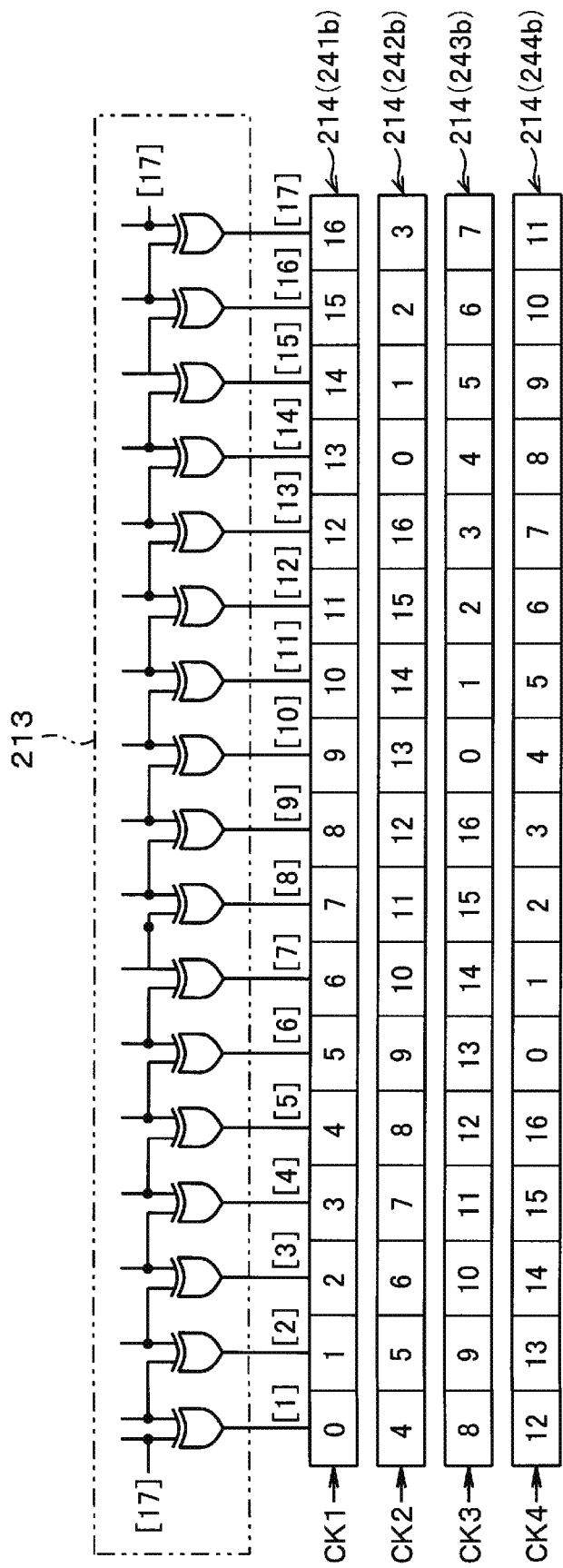
FIG. 8 is a content explanatory diagram of the encode values in the multiple encoders.

FIG. 7 and FIG. 8 show explanatory diagrams of the second embodiment. The second embodiment shows an example in a case of latching the outputs of the delay units DU (G1 to G17) at seventeen stages based on the four sampling clocks CK1 to CK4 and digitalizing (encoding) the position of the pulse signal.

As shown in FIG. 7, a pulse delay circuit 202 in the second embodiment includes the delay units DU (G1 to G17) at seventeen stages. The delay units DU invert and delay the pulse signal PA. The delay units DU are connected in series to form, for example, a ring arrangement. In addition, configurations of latch circuits 241a to 244a and pulse position digitization portion main bodies 241b to 244b are accordance with the gate circuits G1 to G17 at the seventeen stages. The pulse position digitization portion main bodies 241b to 244b respectively include a pulse selector 213 in which the exclusive OR gates at the seventeen stages are connected as the drawing, an encoder 214, a latch circuit 215, and a subtractor 216.

The encoders 214 of the pulse position digitization portion main bodies 241b to 244b are configured to output the encode value in order from the initial value "0" to the final value "16" as shown in FIG. 8. In FIG. 8, the encode value is represented in decimal. However, actually, the encoders 214 of each of the pulse position digitization portion main bodies 241b to 244b are configured by the logic circuit. The encoders 214 bit-outputs any encode value from the initial value "0" to the final value "16" as the digital data of two's complement by receiving the outputs of the pulse selectors 213 and the outputs of the sampling clocks CK1 to CKm. The encode values of the encoders 214 of each of the pulse position digitization portion main bodies 241b to 244b are equally shifted by "4", as shown in FIG. 8. Descriptions of the other configurations will be omitted since the configurations are similar to the configuration of the first embodiment.

In the configuration of the embodiment, the encoder 214 returns from the final value "16" as the previous value to the initial value "0" as the current value to output the encode value. Thereby, the step error occurs. However, the output encode values of the encoders 214 of each of the pulse position digitization portion main bodies 241b to 244b are shifted from each other.

Therefore, the similar effect to the embodiment described above can be obtained. In the embodiment also, the shift amounts Dts are equally set to "4" between the encode values of the encoders 214 of each of the pulse position digitization portion main bodies 241b to 244b. Therefore, it may be possible to reduce occurrence bias of the step error when the A/D conversion processes are executed for many times. It may be possible to equalize the ratio of the shift error occurrence.

Third Embodiment

Figure 9:
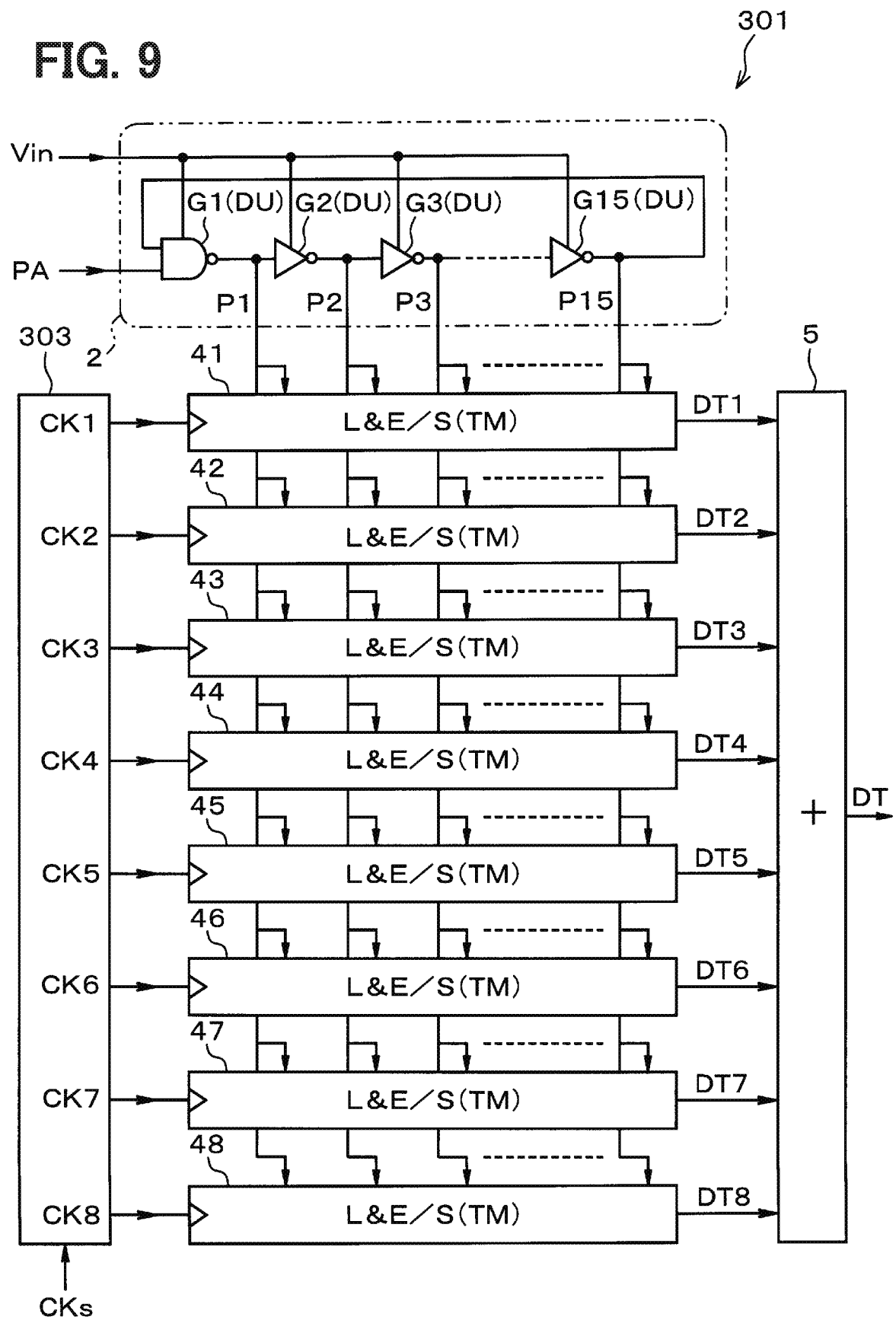
FIG. 9 is an electrical configuration diagram of the A/D conversion circuit according to a third embodiment.
Figure 10:
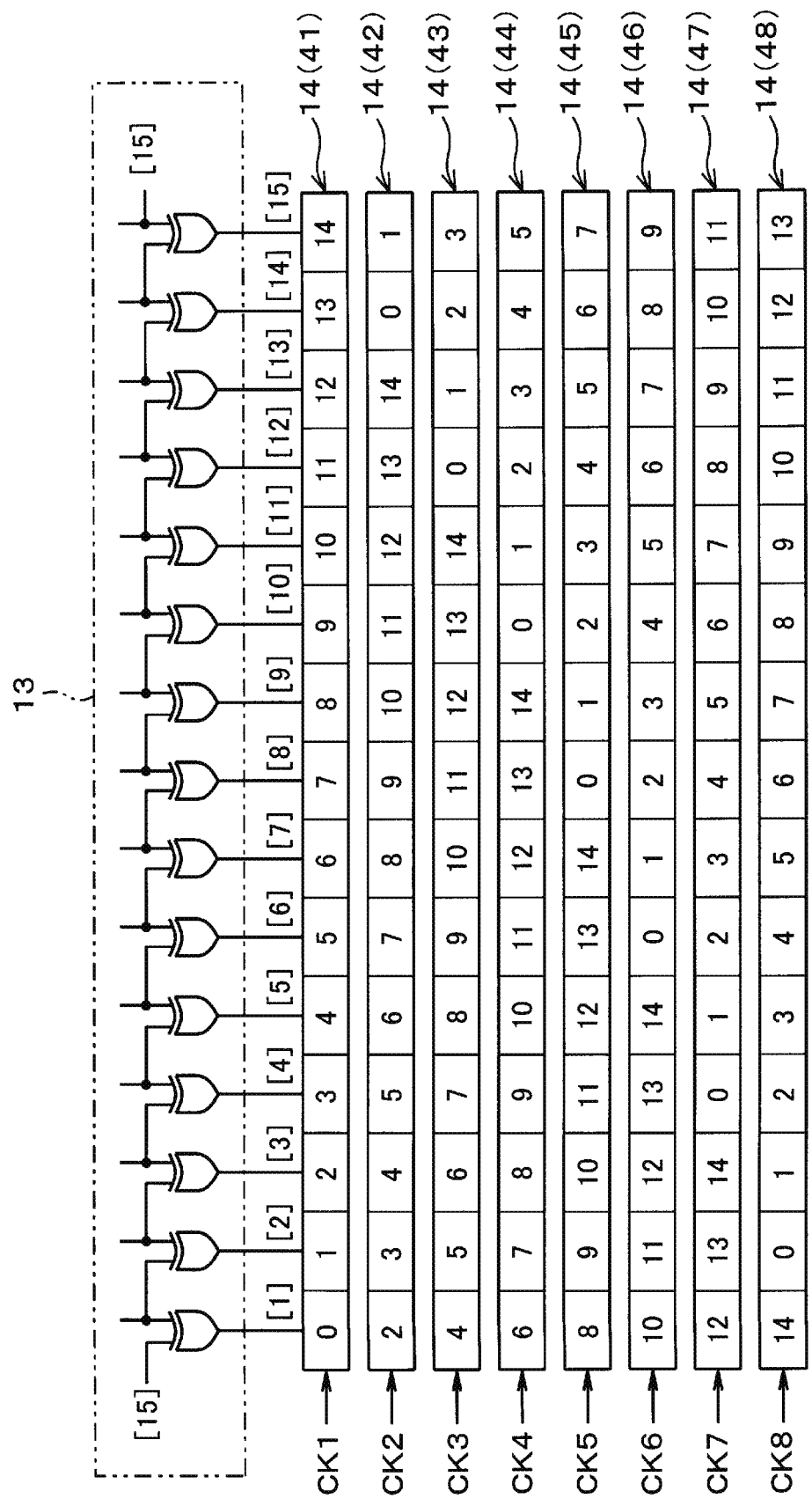
FIG. 10 is a content explanatory diagram of the encode values in the multiple encoders.

FIG. 9 and FIG. 10 show explanatory diagrams of the third embodiment. The embodiment shows an example of a case of latching the outputs of the delay units DU (G1 to G15) at fifteen stages based on the eight sampling clocks CK1 to CK8 and digitalizing (encoding) the position of the pulse signal.

As shown in FIG. 9, an A/D conversion circuit 301 includes a clock generation circuit 303 that outputs the eight sampling clocks CK1 to CK8, and additionally includes the pulse position digitization portions 41 to 48 and the adder 5. That is, the embodiment shows an example in a case of m=8. The internal configurations of the pulse position digitization portions 41 to 48 are similar to the configurations of each of the pulse position digitization portions 41 to 44 shown in the first embodiment. Therefore, descriptions of the internal configuration will be omitted.

The encode values of the encoders 14 of each of the pulse position digitization portions 41 to 48 are equally shifted by "2", as shown in FIG. 10. Descriptions of the other configurations will be omitted since the configurations are similar to the configurations described above.

The third embodiment provides the similar effect to the embodiment described above. The shift amounts Dts of the encode value are equally set between the encoders 14 of each of the pulse position digitization portions 41 to 48. Therefore, it may be possible to reduce occurrence bias of the step error when the A/D conversion processes are executed for many times. It may be possible to equalize the ratio of the shift error occurrence.

Fourth Embodiment

Figure 11:
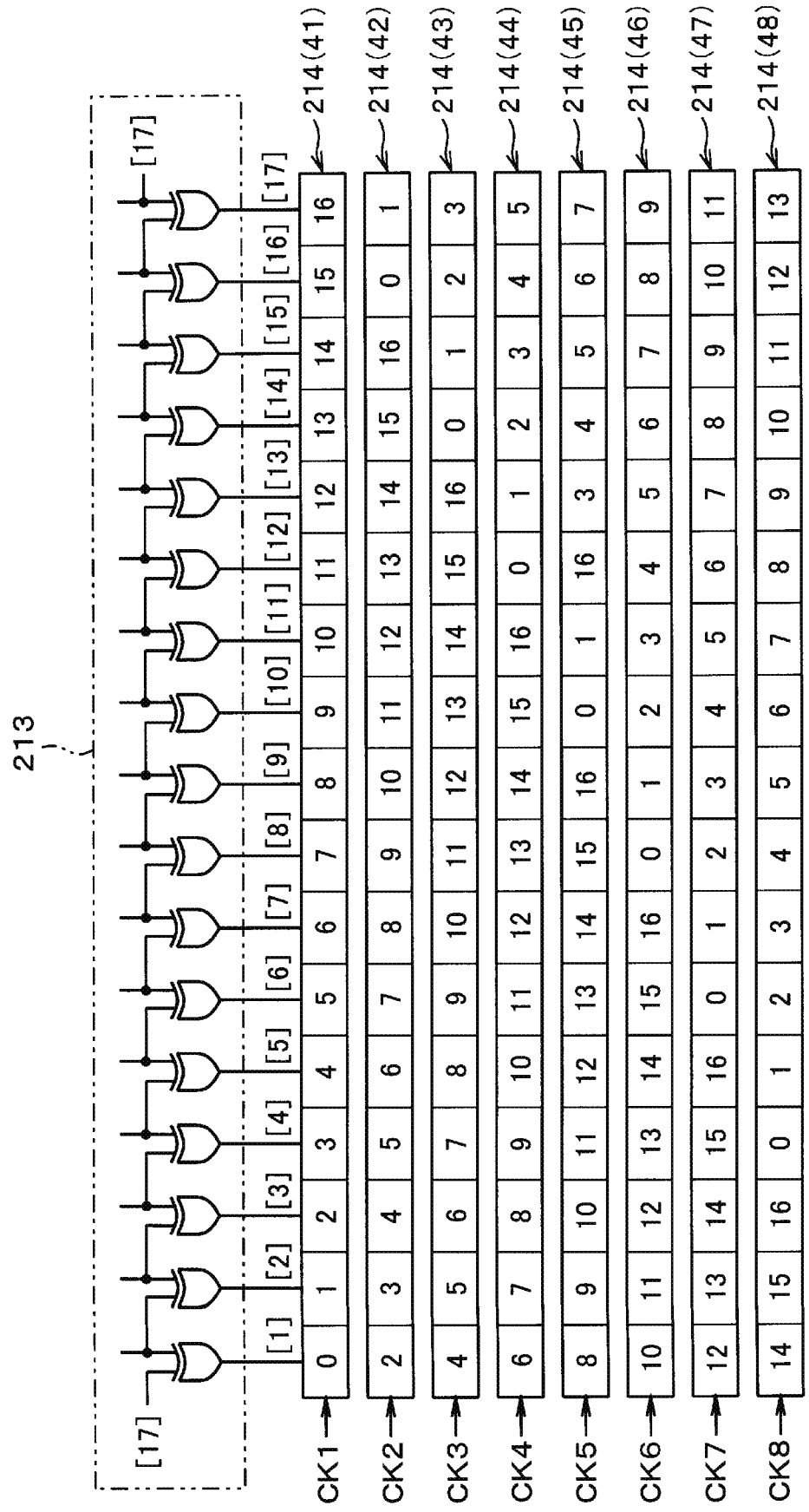
FIG. 11 is a content explanatory diagram of the encode values of the multiple encoders according to a fourth embodiment.

FIG. 11 shows an explanatory diagram of the fourth embodiment. The fourth embodiment shows an example of a case of latching the outputs of the delay units DU (G1 to G17) at seventeen stages based on the eight sampling clocks CK1 to CK8 and digitalizing (encoding) the position of the pulse signal.

In the fourth embodiment, the encoder 214 is configured inside each of the pulse position digitization portions 41 to 48. The encode values of the encoders 214 of each of the pulse position digitization portions 41 to 48 are shifted by "2" from each other as shown in FIG. 11.

Due to the configuration described above, the fourth embodiment provides the similar effect to the embodiment described above. The shift amount of the encode value are equally set to the same value between the encoders 14 of each of the pulse position digitization portions 41 to 48. Therefore, it may be possible to reduce occurrence bias of the step error when the A/D conversion processes are executed for many times. It may be possible to equalize the ratio of the shift error occurrence.

Fifth Embodiment

Figure 12:
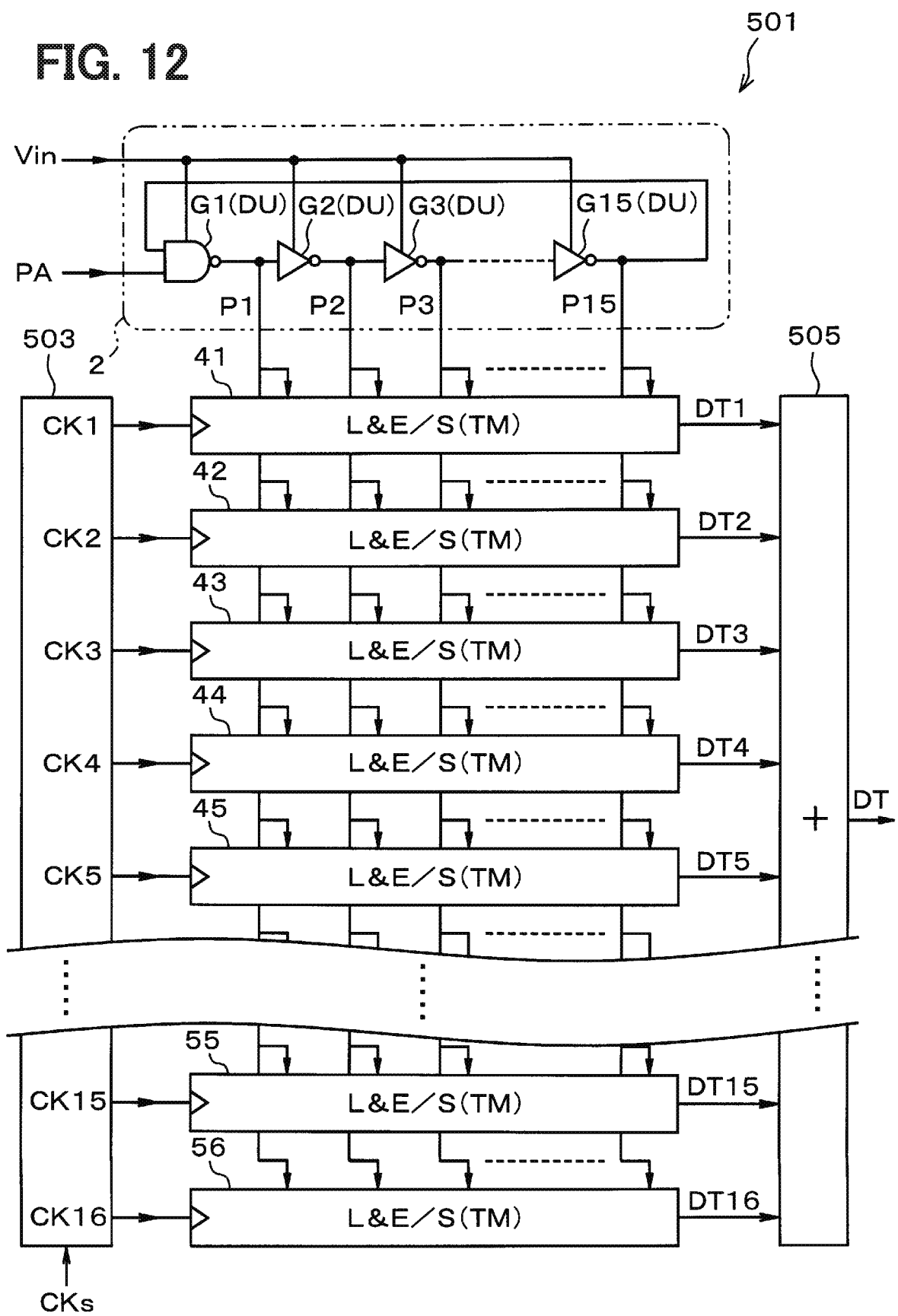
FIG. 12 is an electrical configuration diagram of the A/D conversion circuit according to a fifth embodiment.

FIG. 12 shows an explanatory diagram of the fifth embodiment. The fifth embodiment shows an example of a case of latching the outputs of the delay units DU (G1 to G15) at fifteen stages based on the sixteen sampling clocks CK1 to CK16 and digitalizing (encoding) the position of the pulse signal.

As shown in FIG. 12, a TAD 501 includes a clock generation circuit 503 that outputs the sixteen sampling clocks CK1 to CK16, and additionally includes pulse position digitization portions 41 to 56 and an adder 505. That is, the embodiment shows an example in a case of m=16. The internal configurations of the pulse position digitization portions 41 to 56 are similar to the configurations of each of the pulse position digitization portions 41 to 44 shown in the first embodiment. Therefore, descriptions of the internal configurations will be omitted.

Figure 13:
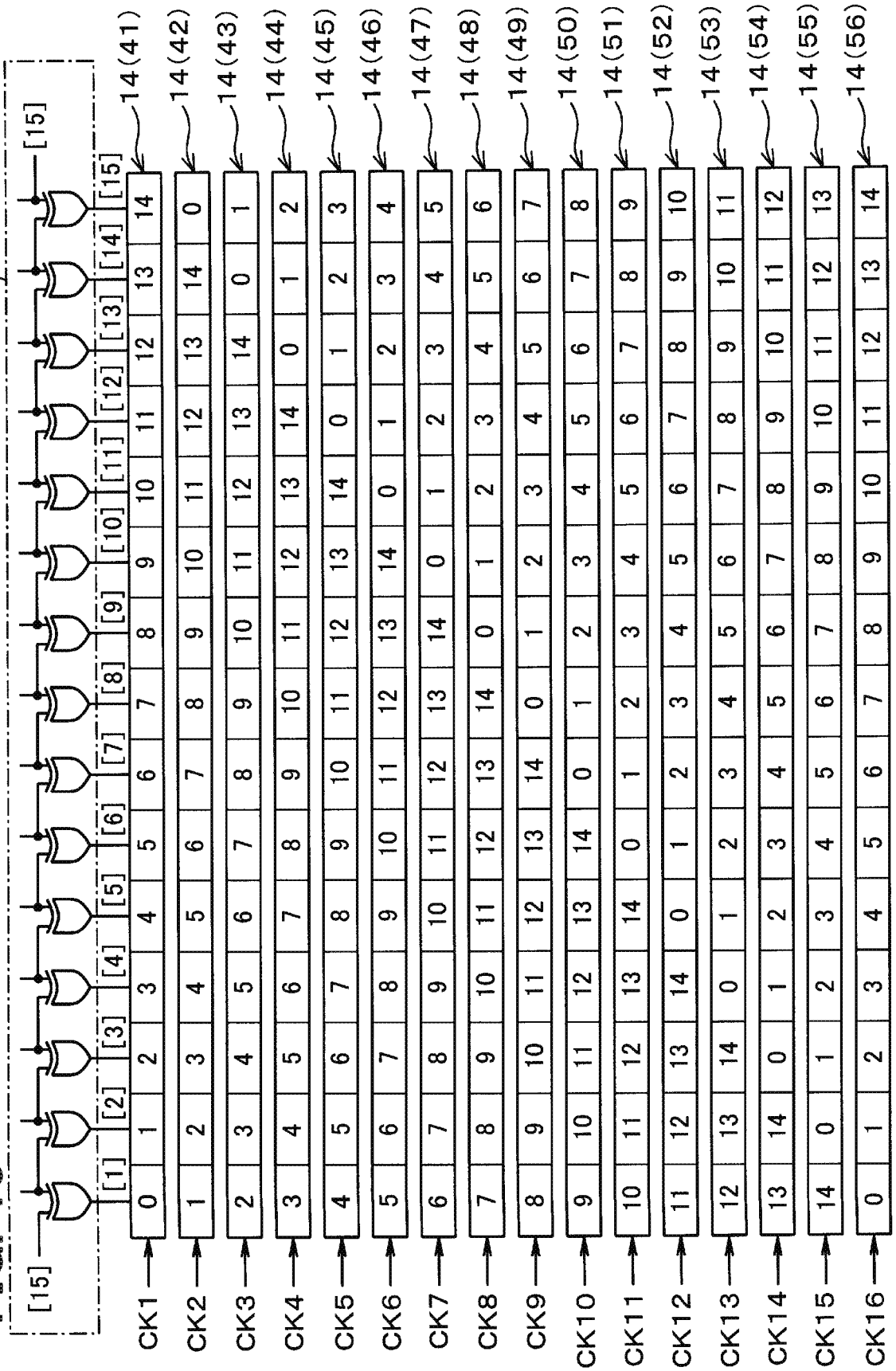
FIG. 13 is a content explanatory diagram of the encode values of the multiple encoders.

The shift amount Dts of the encode values of the encoders 14 of each of the pulse position digitization portions 41 to 56 is set to "1", and the encode values are equally shifted, as shown in FIG. 13. In the fifth embodiment, the number Nckes of clock edge shift times of the sampling clocks CK1 to CK16 equal to 16, and is higher than the number Ndu of delay units DU equal to 15. However, in this case, the shift amount Dts is preferably set to the minimum value of "1". Descriptions of the other configurations will be omitted since the configurations are similar to the configurations described above.

The fifth embodiment provides the similar effect to the embodiment described above. The shift amounts of the encode values are equally set among the encoders 14 of each of the pulse position digitization portions 41 to 55. Therefore, it may be possible to reduce occurrence bias of the step error when the A/D conversion processes are executed for many times. It may be possible to equalize the ratio of the shift error occurrence.

In the fifth embodiment, the encode values of the encoders 14 are same between the two pulse position digitization portions 41 and 56 since the number of sampling clocks CK1 to CK16 is 16, and the number of delay units DU is 15. However, also in this case, since the shift amount Dts of the other encode value is different, the fifth embodiment provides the substantially similar effects to the embodiment described above.

Sixth Embodiment

Figure 14:
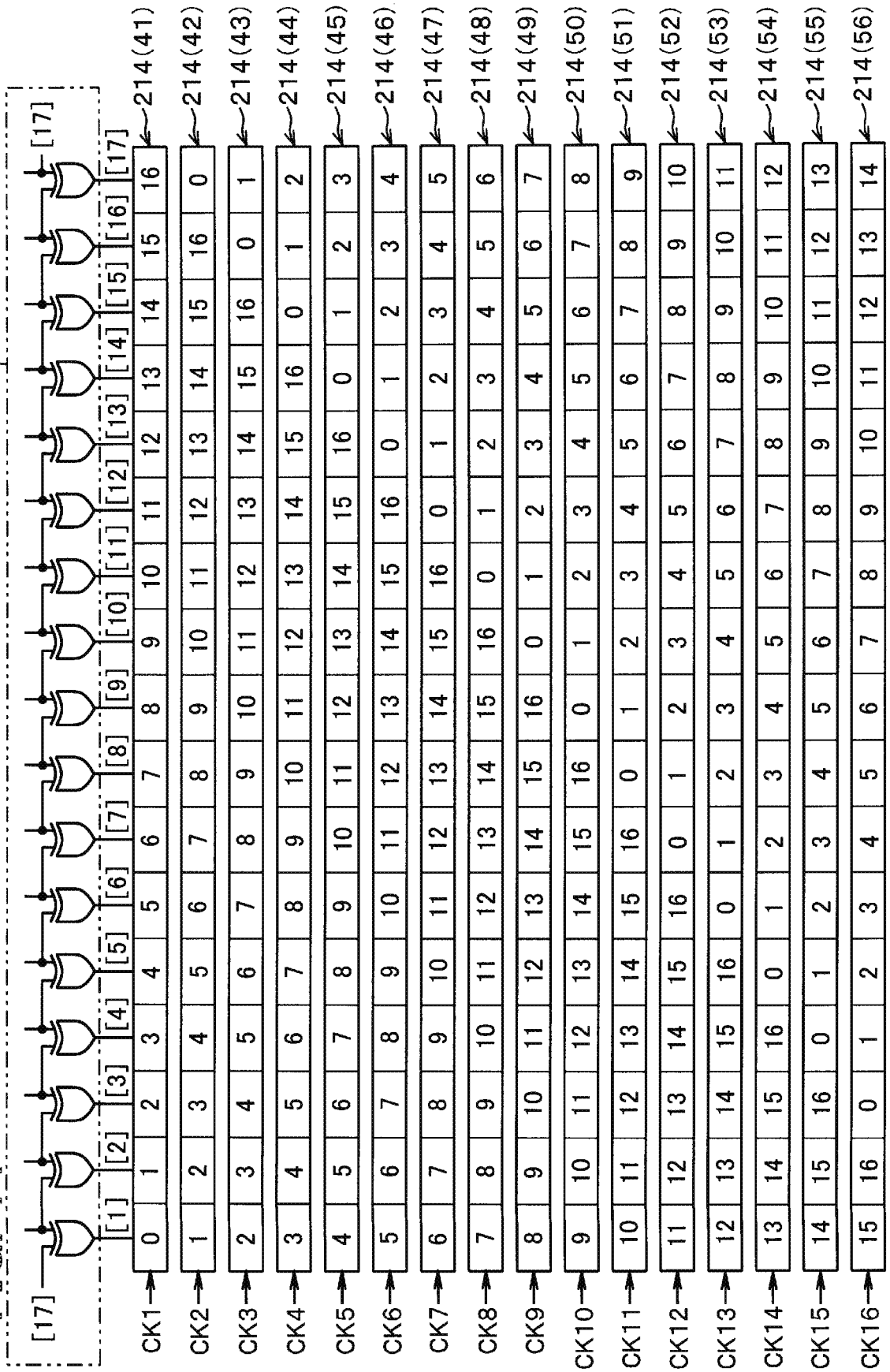
FIG. 14 is a content explanatory diagram of the encode values of the multiple encoders according to a sixth embodiment.

FIG. 14 shows an explanatory diagram of the sixth embodiment. The embodiment shows an example of a case of latching the outputs of the delay units DU (G1 to G17) at seventeen stages based on the sixteen sampling clocks CK1 to CK16 and digitalizing (encoding) the position of the pulse signal.

In the embodiment, the encoder 214 is configured inside each of the pulse position digitization portions 41 to 56. The encode values of the encoders 214 of each of the pulse position digitization portions 41 to 56 are shifted by "1" from each other as shown in FIG. 14.

By setting the encode value described above, the sixth embodiment provides the similar effect to the embodiment described above. The shift amount Dts of the encode value is equally set between the encoders 214 of the multiple pulse position digitization portions 41 to 56. Therefore, it may be possible to reduce occurrence bias of the step error when the A/D conversion processes are executed for many times. It may be possible to equalize the ratio of the shift error occurrence.

Seventh Embodiment

Figure 15:
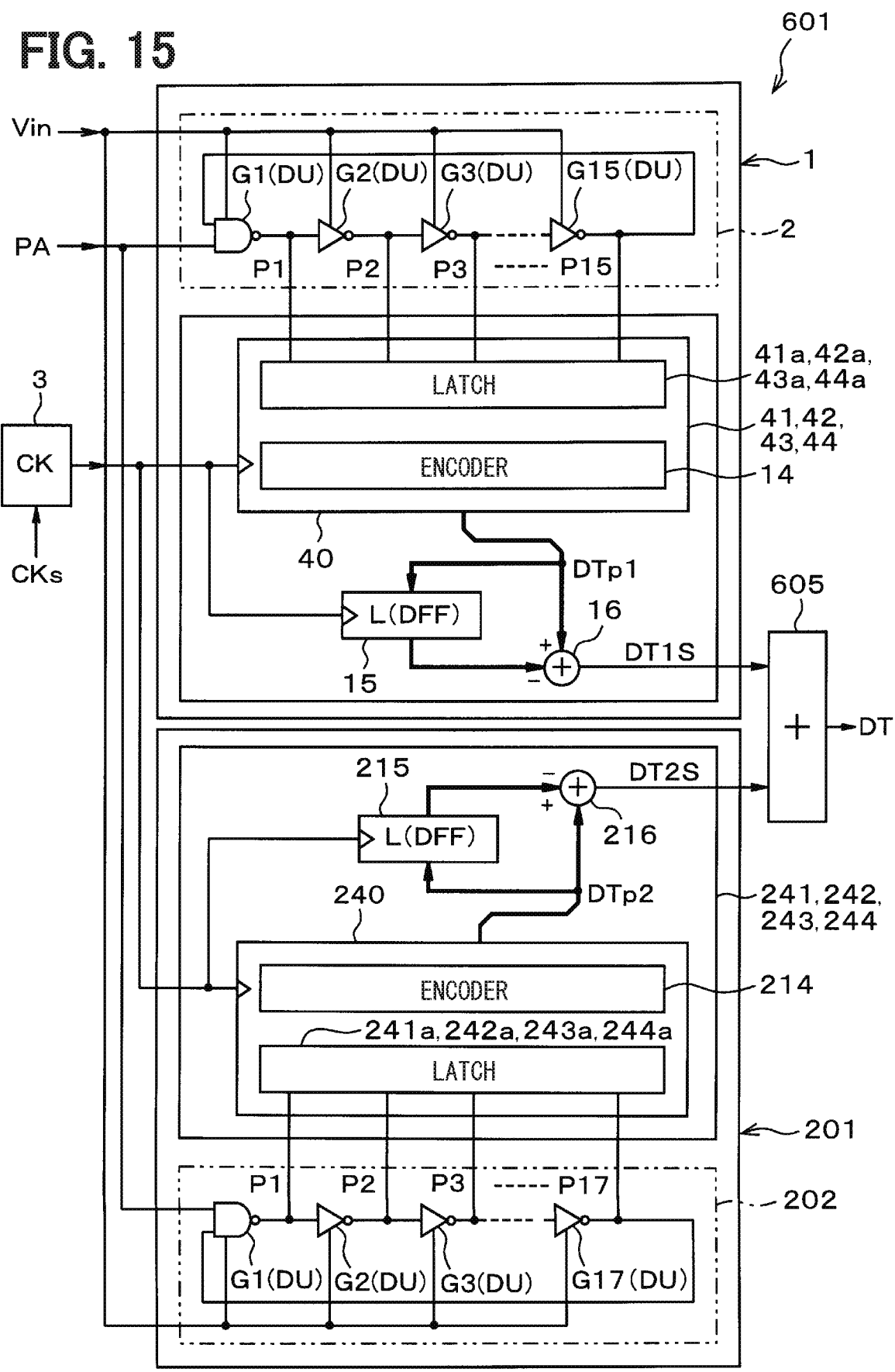
FIG. 15 is an electrical configuration diagram showing details of the A/D conversion circuit according to a seventh embodiment.
Figure 16:
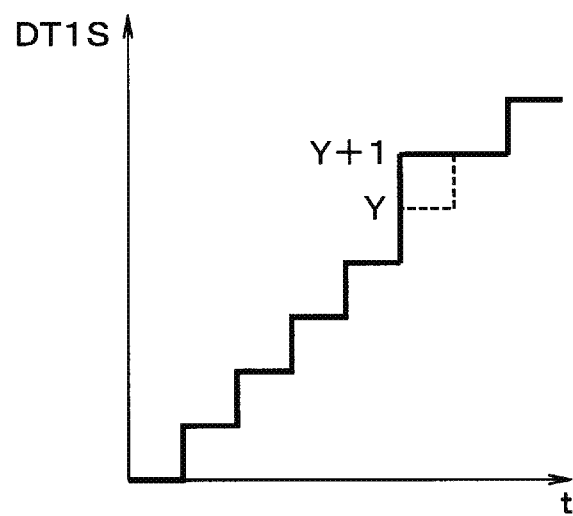
FIG. 16 is an explanatory diagram showing situations of the code missing and the code increase.
Figure 16:
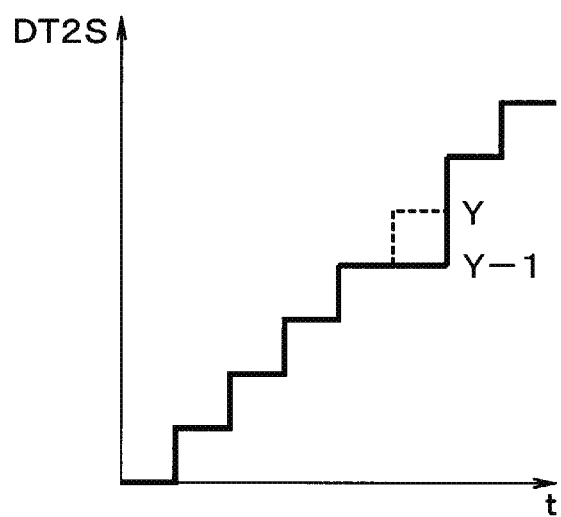
Figure 17:
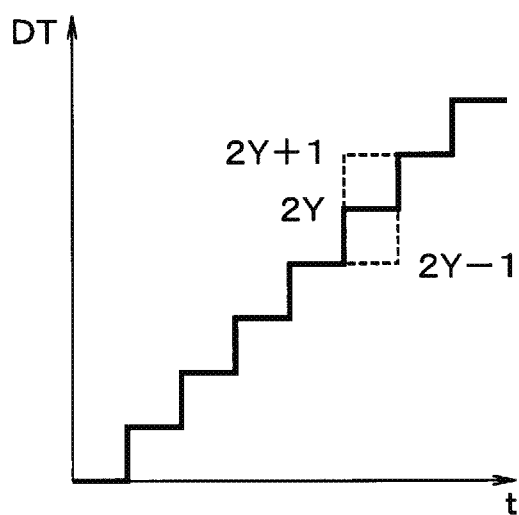
FIG. 17 is an explanatory diagram showing a situation that the code missing and the code increase are offset.

FIGS. 15 to 17 show explanatory diagrams of the seventh embodiment. Since a TAD 601 is configured to have both the function of the first TAD 1 and the function of a second TAD 201, the same parts described in the embodiment described above will be denoted by the same references and description thereof will be omitted as necessary.

The pulse delay circuit 2 and the pulse delay circuit 202 receive the common pulse signal PA and the common analog input signal Vin to operate. The pulse delay circuit 2 corresponds to a first pulse delay portion. The pulse delay circuit 202 corresponds to a second pulse delay portion. The delay unit DU of the pulse delay circuit 2 corresponds to a first delay unit. The delay unit DU of the pulse delay circuit 202 corresponds to a second delay unit.

The pulse position digitization portions 41 to 44 and the pulse position digitization portions 241 to 244 commonly receive the sampling clock CK of the clock generation circuit 3 to operate. This sampling clock CK corresponds to the sampling clocks CK1 to CK4 described in the embodiment described above.

A latch & encoder 40 of the pulse position digitization portions 41 to 44 includes the latch circuits 41a to 44a, the pulse selectors 13 of the pulse position digitization portion main bodies 41b to 44b, and the encoders 14 that are described in the embodiment described above. The latch circuits 41a to 44a correspond to a first latch circuit. The latch & encoder 40 acquires the outputs of the delay units DU (G1 to G15) at the timing based on the output of the clock generation circuit 3, and detects numerical data DTp1 in accordance with the arrival position of the pulse signal PA from the first encoders 14. In each of the multiple first encoders 14, the first encode value is cyclically set from the first initial value "0" to the first final value "14". The shift amount Dts of the first encode value of the first encoder 14 is equally set among the multiple first encoders 14, as shown in FIG. 4 of the first embodiment.

The numerical data DTp1 is input to the latch circuit 15 and the first subtractor 16. The latch circuit 15 holds the numerical data DTp1. The first subtractor 16 as a first subtraction portion calculates a difference between the previous value (the holding value of the latch circuit 15) and the current value of the numerical data DTp1 sampled based on the successive sampling clock CK, by the two's complement operation. Thereby, it may be possible to calculate the difference of the arrival positions of the pulse signal PA. Then, similarly to the embodiment described above, it may be possible to reduce the occurrence bias of the step error when the ND conversion processes are executed for many times. It may be possible to equalize the ratio of the step error occurrence. This calculation result DT1S is output to an adder 605.

By contrast, a latch & encoder 240 of the pulse position digitization portions 241 to 244 includes the latch circuits 241a to 244a, the pulse selectors 213 of the pulse position digitization portion main bodies 241b to 244b, and the encoders 214 that are described in the embodiment described above. The latch circuits 241a to 244a correspond to a second latch circuit. The latch & encoder 240 acquires the outputs of the seventeen delay units DU (G1 to G17) at the timing based on the output of the clock generation circuit 3, and detects numerical data DTp2 in accordance with the arrival position of the pulse signal PA from the second encoder 214. In each of the multiple second encoders 214, the second encode value is cyclically set from the second initial value "0" to the second final value "16". The shift amount Dts of the second encode value of the second encoder 214 is equally set among the multiple second encoders 214, as shown in FIG. 7 of the second embodiment.

The numerical data DTp2 is input to the latch circuit 215 and the second subtractor 216. The latch circuit 215 holds the numerical data DTp2. The second subtractor 216 as a second subtraction portion calculates a difference between the previous value (the holding value of the latch circuit 215) and the current value of the numerical data DTp2 sampled based on the successive sampling clock CK, by the two's complement operation, and outputs the difference to the adder 5. Thereby, it may be possible to calculate the difference of the arrival positions of the pulse signal PA. Also in this case, similarly to the embodiment described above, it may be possible to reduce the occurrence bias of the step error when the A/D conversion processes are executed for many times. It may be possible to equalize the ratio of the step error occurrence. This calculation result DT2S is also output to the adder 605.

When the subtractor 16 performs the subtraction by the two's complement, as shown in the upper part of FIG. 16, the number of delay units DU is 1 lower than 16 (=2 to the fourth power, in other words, $2^4$) in the calculation result DT1S of the first TAD 1. Therefore, the code increase representing a state that the number is one higher than the correct value Y may occur. By contrast, when the subtractor 216 performs the subtraction by the two's complement, as shown in the lower part of FIG. 16, the number of delay units DU is 1 more than 16 in the calculation result DT2S of the second TAD 201. Therefore, the code missing representing a state that the number is one lower than the correct value Y may occur.

The adder 605 adds the output data DT1S of the first TAD 1 and the output data DT2S of the second TAD 201. Therefore, as shown in FIG. 17, it may be possible to acquire, as the A/D conversion data DT, a value of 2Y corresponding to the value obtained by offsetting the code increase and the code missing. Thereby, it may be possible to offset the code missing and the code increase.

Other Embodiments

The present disclosure is not limited to the embodiment described above, and, for example, may be intended to cover modifications or extensions, which will be described.

The embodiment described above shows the configuration in which the only fifteen or seventeen delay units DU are connected in series. However, a configuration in which an odd number of delay units DU are connected in series may be employed. The odd number may be expressed by the number of ($2^n \pm 1$) (n is a natural number equal to or more than 1).

The embodiment described above shows the configurations in which the number of encoder 14 and the number of encoders 214 are 4, 8, or 16. However, the number of encoder 14 and the number of encoders 214 may be set to 2 or more.

The seventh embodiment shows the configuration in which the number of delay units DU is 15 or 17 expressed by the number of ($2^n \pm 1$). However, it is not limited to this. The delay units DU having only the number of ($2 \pm (2x-1)$) may be connected in series (x is a natural number of 1 or more).

The seventh embodiment shows the configuration in which the latch outputs of the latch circuits 41a to 44a are sampled based on the sampling clocks CK1 to CK4 by the clock generation circuit 3. However, it is not limited to this. In the configuration, the latch outputs may be sampled by the clock generation circuit 303 or the clock generation circuit 503. That is, the numeral number m may be set to any of 4, 8, or 16.

The seventh embodiment shows the configuration in which the shift amounts Dts of the first encode value of the first encoder 14 and the second encode value of the second encoder 214 are equally set. However, it is not limited to this.

The first encode value of the encoder 14 in the embodiment described above may be set so as to shift between at least two encoders 14. The second encode value of the encoder 214 in the seventh embodiment may be set so as to shift between at least two encoders 214.

The configuration of the pulse delay circuit 2 in which the delay units DU including the NAND gate G1 and the NOT gates G2 to G15 are connected in a ring shape is shown. However, it is not limited to this. As long as the delay units DU are connected in series, the delay units DU may not be connected in the ring shape.

Although the present disclosure is described based on the above embodiments, the present disclosure is not limited to the embodiments and the structures. The present disclosure may be intended to cover various modification examples and equivalents thereof. In addition, various modes/combinations, one or more elements added/subtracted thereto/therefrom, may also be considered as the present disclosure and understood as the technical thought thereof.

The invention claimed is:

1. An A/D conversion circuit configured to convert an analog signal into numerical data, the A/D conversion circuit comprising:
   a pulse delay circuit that
      includes a plurality of delay units that
         are connected in series, and
         are configured to invert and delay a pulse signal, and
      is configured to change a numerical number of the delay units which the pulse signal passes through in accordance with a value of the analog signal;
   a plurality of latch circuits configured to
      synchronize the pulse signal delayed by the pulse delay circuit with a plurality of sampling clocks, and
      latch the pulse signal;
   a plurality of encoders each of which is configured to set a position of the pulse signal to the numerical data by circulating encode values periodically set in order from an initial value to a final value to synchronously sample the encode values based on the pulse signal latched by the plurality of latch circuits and the plurality of sampling clocks;
a plurality of subtractors configured to calculate each of differences between a previous value corresponding to the numerical data of the encoders and a current value corresponding to the numerical data of the encoders, the numerical data being synchronously sampled by successive sampling clocks; and
an adder configured to add subtraction results of the plurality of subtractors to output digital data, wherein:
the encode values are set to be shifted from each other between at least two encoders of the plurality of encoders; and
a numerical number of the delay units connected in series is odd.

2. The A/D conversion circuit according to claim 1, wherein:
shift amounts of the encode values are equally set between the plurality of encoders.

3. The A/D conversion circuit according to claim 2, wherein:
at a same timing, each of the shift amounts of the encode values corresponds to a difference value between one of the encode values in one of the encoders and another one of the encode values in another one of the encoders.

4. The A/D conversion circuit according to claim 2, wherein:
the shift amounts correspond to a value obtained by dividing the numerical number of the delay units by a numerical number of a clock edge shift of the sampling clock.

5. The A/D conversion circuit according to claim 1, wherein:
the plurality of encoders include at least two encoders.

6. The A/D conversion circuit according to claim 1, wherein:
each of the subtraction results corresponds to each of the differences in each of the subtractors.

7. An A/D conversion circuit configured to convert an analog signal into numerical data, the A/D conversion circuit comprising:
a first pulse delay circuit that
includes a plurality of first delay units that
are connected in series, and
are configured to invert and delay a pulse signal, and
is configured to change a numerical number of the first delay units which the pulse signal passes through in accordance with a value of the analog signal;
a plurality of first latch circuits configured to
synchronize the pulse signal delayed by the first pulse delay circuit with a plurality of sampling clocks, and
latch the pulse signal;
a plurality of first encoders each of which configured to set a position of the pulse signal to the numerical data by sampling first encode values periodically set from a first initial value to a first final value based on the pulse signal latched by the plurality of first latch circuits and the plurality of sampling clocks;
a plurality of first subtractors configured to calculate each of differences between a previous value corresponding to numerical data of the first encoders and a current value corresponding to the numerical data of the first encoders, the numerical data being sampled by successive sampling clocks;
a second pulse delay circuit that
includes a plurality of second delay units that
are connected in series, and
are configured to invert and delay the pulse signal, and
is configured to change a numerical number of the second delay units which the pulse signal passes through in accordance with the value of the analog signal;
a plurality of second latch circuits configured to
synchronize the pulse signal delayed by the second pulse delay circuit with the plurality of sampling clocks, and
latch the pulse signal;
a plurality of second encoders each of which is configured to set a position of the pulse signal to the numerical data by sampling second encode values periodically set from a second initial value to a second final value based on the pulse signal latched by the plurality of second latch circuits and the plurality of sampling clocks;
a plurality of second subtractors configured to calculate each of differences between a previous value of numerical data of the second encoders and a current value of the numerical data of the second encoders, the numerical data being sampled by the successive sampling clocks; and
an adder configured to output the numerical data by adding subtraction results of the plurality of first subtractors and adding subtraction results of the plurality of second subtractors, wherein:
the first encode values are set to be shifted from each other between the at least two encoders;
the second encode values are set to be shifted between the at least two second encoders of the plurality of second encoders;
a numerical number of the first delay units connected in series is defined as $(2^n-(2x-1))$;
a numerical number of the second delay units connected in series is defined as $(2^n+(2x-1))$;
n of $(2^n-(2x-1))$ or $(2^n+(2x-1))$ is a numeral number equal to or more than 1; and
x of $(2^n-(2x-1))$ or $(2^n+(2x-1))$ is a numeral number equal to or more than 1.

8. The A/D conversion circuit according to claim 7, wherein:
shift amounts of the first encode values are equally set between the plurality of first encoders; and
shift amounts of the second encode values are equally set between the plurality of second encoders.

9. The A/D conversion circuit according to claim 7, wherein:
the plurality of first encoders include at least two first encoders; and
the plurality of second encoders include at least two second encoders.

* * * * *